United States Patent
Gu et al.

(10) Patent No.: US 11,875,715 B2
(45) Date of Patent: Jan. 16, 2024

(54) SHIFT REGISTER, GATE DRIVING CIRCUIT AND DISPLAY PANEL

(71) Applicants: Hefei BOE Optoelectronics Technology Co., Ltd., Anhui (CN); BOE Technology Group Co., Ltd., Beijing (CN)

(72) Inventors: Honggang Gu, Beijing (CN); Junsheng Chen, Beijing (CN); Jie Song, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 209 days.

(21) Appl. No.: 17/417,470

(22) PCT Filed: Dec. 29, 2020

(86) PCT No.: PCT/CN2020/140528
§ 371 (c)(1),
(2) Date: Jun. 23, 2021

(87) PCT Pub. No.: WO2021/169562
PCT Pub. Date: Sep. 2, 2021

(65) Prior Publication Data
US 2022/0335870 A1 Oct. 20, 2022

(30) Foreign Application Priority Data
Feb. 25, 2020 (CN) .......................... 202010115226.1

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0408* (2013.01);
(Continued)

(58) Field of Classification Search
CPC .. G11C 19/28; G09G 2310/0267; G09G 3/20; G09G 2310/0286
See application file for complete search history.

(56) References Cited

U.S. PATENT DOCUMENTS

| 2017/0039968 A1* | 2/2017 | Chen | G11C 19/28 |
| 2020/0273503 A1* | 8/2020 | Wang | G11C 7/20 |
| 2021/0327386 A1* | 10/2021 | Dong | G09G 3/3677 |

FOREIGN PATENT DOCUMENTS

| CN | 103928005 A | 7/2014 |
| CN | 104732939 A | 6/2015 |

(Continued)

OTHER PUBLICATIONS

First Office Action dated Feb. 2, 2021 for application No. CN202010115226.1 with English translation attached.
Second Office Action dated Nov. 30, 2021 for application No. CN202010115226.1 with English translation attached.
Decision of Rejection dated Jun. 24, 2021 for application No. CN202010115226.1 with English translation attached.

*Primary Examiner* — Xuemei Zheng
(74) *Attorney, Agent, or Firm* — Nath, Goldberg & Meyer; Joshua B. Goldberg

(57) ABSTRACT

The disclosure provides a shift register, a gate driving circuit and a display panel. The shift register includes: an input sub-circuit and a first output sub-circuit; the input sub-circuit pre-charges, in response to an input signal, a pull-up node by a first power voltage; the pull-up node is a coupling node at which the input sub-circuit and the output sub-circuit are coupled; the first output sub-circuit outputs a clock signal through a first signal output terminal in response to a potential of the pull-up node; the shift register further includes: a first noise reduction sub-circuit and/or a second (Continued)

noise reduction sub-circuit; the first noise reduction sub-circuit performs noise reduction on the pull-up node through a non-operation level signal in a blank period; the second noise reduction sub-circuit performs noise reduction on the first signal output terminal by the non-operation level signal during the blank period.

16 Claims, 8 Drawing Sheets

(52) U.S. Cl.
CPC .............. *G09G 2300/0842* (2013.01); *G09G 2310/0267* (2013.01); *G09G 2310/0286* (2013.01); *G09G 2310/08* (2013.01)

(56) References Cited

FOREIGN PATENT DOCUMENTS

| | | | | | |
|---|---|---|---|---|---|
| CN | 104835466 | A | * | 8/2015 | |
| CN | 104835466 | A | | 8/2015 | |
| CN | 108281123 | A | * | 7/2018 | ............. G09G 3/007 |
| CN | 108597437 | A | | 9/2018 | |
| CN | 109192238 | A | * | 1/2019 | ............. G09G 3/20 |
| CN | 110070822 | A | | 7/2019 | |
| CN | 110517622 | A | | 11/2019 | |
| CN | 110599971 | A | | 12/2019 | |
| CN | 110706639 | A | | 1/2020 | |
| CN | 111210755 | A | | 5/2020 | |
| KR | 20140079106 | A | | 6/2014 | |

* cited by examiner

SHIFT REGISTER, GATE DRIVING CIRCUIT AND DISPLAY PANEL

This is a National Phase Application filed under 35 U.S.C. 371 as a national stage of PCT/CN2020/140528, filed Dec. 29, 2020, an application claiming the benefit of Chinese Application No. 202010115226.1, filed Feb. 25, 2020, the content of each of which is hereby incorporated by reference in its entirety.

TECHNICAL FIELD

The present application relates to the field of display technology, and particularly relates to a shift register, a gate driving circuit and a display panel.

BACKGROUND

The Gate Driver on Array (GOA) technology can integrate a gate driving circuit on an array substrate of a display panel, to replace a driver chip made of an external silicon chip, and can omit a Gate Integrated Circuit (Gate IC) part and a Fan-out wiring space, thereby simplifying the structure of the display product.

SUMMARY

The present disclosure is directed to at least one of technical problems in the related art, and provides a shift register, a gate driving circuit and a display panel.

In a first aspect, an embodiment of the present disclosure provides a shift register, which includes: an input sub-circuit and a first output sub-circuit;

the input sub-circuit is configured to pre-charge, in response to an input signal, a pull-up node by a first power voltage; the pull-up node is a coupling node at which the input sub-circuit, the output sub-circuit and a pull-down sub-circuit are coupled;

the output sub-circuit is configured to output a clock signal through a first signal output terminal in response to a potential of the pull-up node; where, the shift register further includes a first noise reduction sub-circuit and/or a second noise reduction sub-circuit;

the first noise reduction sub-circuit is configured to perform, in response to a first noise reduction control signal, noise reduction on the pull-up node through a non-operation level signal in a blank period;

the second noise reduction sub-circuit is configured to perform, in response to a second noise reduction control signal, noise reduction on the first signal output terminal by a non-operation level signal during the blank period.

In some implementations, the first noise reduction sub-circuit includes a first transistor;

a first electrode of the first transistor is coupled with the pull-up node, a second electrode of the first transistor is coupled with a non-operation level terminal, and a control electrode of the first transistor is coupled with a first noise reduction control signal terminal.

In some implementations, the second noise reduction sub-circuit includes a second transistor;

a first electrode of the second transistor is coupled with the first signal output terminal, a second electrode of the second transistor is coupled with the non-operation level terminal, and a control electrode of the second transistor is coupled with a second noise reduction control signal terminal.

In some implementations, the shift register further includes a plurality of second output sub-circuits;

each of the plurality of second output sub-circuits is configured to output the signal output from the first signal output terminal through a second signal output terminal corresponding thereto in response to a switch control signal corresponding thereto.

In some implementations, each of the plurality of second output sub-circuits includes a third transistor;

a first electrode of the third transistor is coupled with the first signal output terminal, a second electrode of the third transistor is coupled with the second signal output terminal, and a control electrode of the third transistor is coupled with a switch control signal terminal.

In some implementations, the shift register further includes a plurality of second output sub-circuits;

each of the plurality of second output sub-circuits is configured to output a driving signal through a second signal output terminal corresponding thereto in response to the signal output from the first signal output terminal.

In some implementations, each of the plurality of second output sub-circuits includes a third transistor;

a first electrode of the third transistor is coupled with a driving signal terminal corresponding to the third transistor, a second electrode of the third transistor is coupled with the second signal output terminal, and a control electrode of the third transistor is coupled with the first signal output terminal.

In some implementations, the shift register further includes a pull-down control sub-circuit, a pull-down sub-circuit, a third noise reduction sub-circuit, a fourth noise reduction sub-circuit;

the pull-down control sub-circuit is configured to transmit, in response to an operation level signal, the operation level signal to a pull-down node; the pull-down node is a coupling node at which the pull-down control sub-circuit and the pull-down sub-circuit are coupled;

the pull-down sub-circuit is configured to pull down a potential of the pull-down node by the non-operation level signal in response to the potential of the pull-up node;

the third noise reduction sub-circuit is configured to perform noise reduction on the pull-up node by the non-operation level signal in response to the potential of the pull-down node;

the fourth noise reduction sub-circuit is configured to perform noise reduction on the first signal output terminal by the non-operation level signal in response to the potential of the pull-down node.

In some implementations, the pull-down control sub-circuit includes a fourth transistor and a fifth transistor;

a first electrode of the fourth transistor is coupled with a control electrode of the fourth transistor, a first electrode of the fifth transistor and an operation level terminal, and a second electrode of the fourth transistor is coupled with the pull-down sub-circuit and a control electrode of the fifth transistor; and a second electrode of the fifth transistor is coupled to the pull-down node.

In some implementations, the pull-down sub-circuit includes a sixth transistor and a seventh transistor;

a first electrode of the sixth transistor is coupled with the pull-down node, a second electrode of the sixth transistor is coupled with the non-operation level terminal, and a control electrode of the sixth transistor is coupled with the pull-up node;

a first electrode of the seventh transistor is coupled with a pull-down control sub-circuit, a second electrode of the seventh transistor is coupled with the non-operation level terminal, and a control electrode of the seventh transistor is coupled with the pull-up node.

In some implementations, the third noise reduction sub-circuit includes an eighth transistor;

a first electrode of the eighth transistor is coupled with the pull-up node, a second electrode of the eighth transistor is coupled with the non-operation level terminal, and a control electrode of the eighth transistor is coupled with the pull-down node.

In some implementations, the fourth noise reduction sub-circuit includes a ninth transistor;

a first electrode of the ninth transistor is coupled with the first signal output terminal, a second electrode of the ninth transistor is coupled with the non-operation level terminal, and a control electrode of the ninth transistor is coupled with the pull-down node.

In some implementations, the shift register further includes a plurality of fifth noise reduction sub-circuits provided in one-to-one correspondence with a plurality of second signal output terminals;

each of the plurality of fifth noise reduction sub-circuits is configured to perform noise reduction on the second output terminal corresponding thereto by the non-operation level signal in response to the potential of the pull-down node.

In some implementations, each of the plurality of fifth noise reduction sub-circuits includes a tenth transistor;

a first electrode of the tenth transistor is coupled with the second signal output terminal corresponding to the tenth transistor, a second electrode of the tenth transistor is coupled with the non-operation level terminal, and a control electrode of the tenth transistor is coupled with the pull-down node.

In some implementations, the shift register further includes a reset sub-circuit;

the reset sub-circuit is configured to reset the pull-up node by a second power voltage in response to a reset signal.

In some implementations, the reset sub-circuit includes an eleventh transistor;

a first electrode of the eleventh transistor is coupled with the pull-up node, a second electrode of the eleventh transistor is coupled with the second power voltage terminal, and a control electrode of the eleventh transistor is coupled with a reset signal terminal.

In some implementations, the input sub-circuit includes a twelfth transistor;

a first electrode of the twelfth transistor is coupled with the first power voltage terminal, a second electrode of the twelfth transistor is coupled with the pull-up node, and a control electrode of the twelfth transistor is coupled with the signal input terminal.

In some implementations, the output sub-circuit includes a thirteenth transistor and a storage capacitor;

a first electrode of the thirteenth transistor is coupled with a clock signal terminal, a second electrode of the thirteenth transistor is coupled with a signal output terminal and a second terminal of the storage capacitor, and a control electrode of the thirteenth transistor is coupled with the pull-up node and a first terminal of the storage capacitor.

In a second aspect, an embodiment of the present disclosure provides a gate driving circuit, which includes: the shift register described above; where, the signal input terminal of the shift register of a current stage is coupled with the signal output terminal of the shift register of a previous stage; the reset signal terminal of the shift register of the current stage is coupled with the signal output terminal of the shift register of a next stage.

In a third aspect, an embodiment of the present disclosure provides a display panel, which includes the gate driving circuit described above.

DRAWINGS

DETAILED DESCRIPTION

Figure 1:
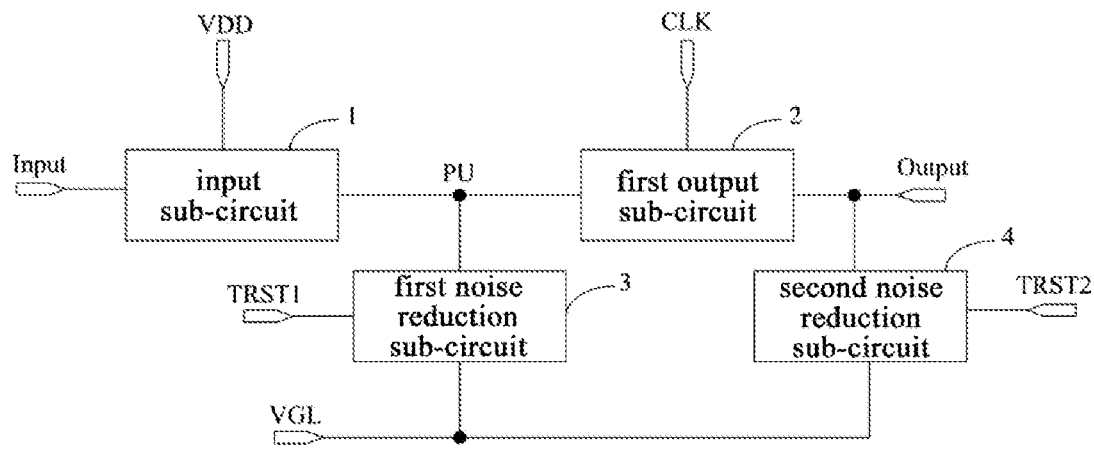
FIG. 1 is a schematic structural diagram of a shift register according to an embodiment of the present disclosure.

In order to make the technical solutions of the present disclosure better understood, the present disclosure is further described in detail with reference to the accompanying drawings and specific embodiments below.

Unless defined otherwise, technical or scientific terms used herein shall have the ordinary meaning as understood by one of ordinary skill in the art to which the present disclosure belongs. The use of "first", "second" and the like in the present disclosure is not intended to indicate any order, quantity, or importance, but rather is used to distinguish one element from another. Also, the use of the terms "a", "an" or "the" and similar referents do not denote a limitation of quantity, but rather denote the presence of at least one. The word "include" or "comprise", and the like, is intended to mean that the element or item preceding the word contains the element or item listed after the word and its equivalent, but not the exclusion of other elements or items. The terms "coupled" or "connected" and the like are not restricted to physical or mechanical connections, but may include electrical connections, whether direct or indirect. The positional relationship words "upper" and the like are used merely to indicate relative positional relationships, which may change accordingly when an absolute position of the object being described changes.

A display panel in the related art generally has a display area and a peripheral area surrounding the display area; a plurality of pixel units arranged in an array are arranged in the display area, and each pixel unit is provided with a pixel circuit; the pixel units in a same row are coupled with a same gate line, and the pixel units in a same column are coupled with a same data line. The gate driving circuit is arranged in the peripheral area and includes a plurality of shift registers GOA cascaded, the shift registers are arranged in one-to-one correspondence with gate lines, namely each shift register is coupled with one of the gate lines. When a frame of picture is displayed, the shift registers output gate scanning signals to the gate lines corresponding thereto one by one, so as to complete the row-by-row scanning of the pixel circuits, and data voltage signals are written into the pixel circuits of a row by the data lines while the gate line corresponding to the row is scanned so as to lighten the pixel units of the row. A blank period exists between displays of any two frames of picture, and during the blank period, each row of pixel units do not display, at this time, each of the shift registers are required to be capable of outputting a stable non-operation level signal, so that the completion of the display of the current frame of picture can be ensured, and the next frame of picture can be displayed stably. In this regard, the following embodiments are provided.

It should be noted that the transistors used in the embodiments of the present disclosure may be thin film transistors or field effect transistors or other devices with the same characteristics, and since the source and the drain of the transistor used are symmetrical, the source and the drain are not different. In the embodiments of the present disclosure, to distinguish the source and the drain of the transistor, one of the source and the drain is referred to as a first electrode, the other is referred to as a second electrode, and the gate is referred to as a control electrode. In addition, the transistors can be divided into N-type and P-type according to the characteristics of the transistors, and in the following embodiments, a case where the N-type transistors are used is taken as an example for explanation, when the N-type transistors are used, the first electrode is the source of the N-type transistor, the second electrode is the drain of the N-type transistor, and when a high-level signal is input to the gate, the source and the drain are conducted to allow a current flowing between them, and for the P-type transistors, the opposite is true. It is contemplated that implementation with P-type transistors will be readily contemplated by those skilled in the art without creative labor, and thus, are within the protection scope of the present disclosure.

In the embodiments of the present disclosure, since the transistors used are N-type transistors, an operation level signal in the embodiments of the present disclosure refers to a high-level signal, and a non-operation level signal refers to a low-level signal; a corresponding operation level terminal is a high-level signal terminal, and a non-operation level terminal is a low-level signal terminal. A first power voltage written into a first power voltage terminal is higher than a second power voltage written into a second power voltage terminal, in the embodiments of the present disclosure, the first power voltage is a high power voltage, and the second power voltage is a low power voltage.

In a first aspect, as shown in FIG. 1, an embodiment of the present disclosure provides a shift register, which includes an input sub-circuit 1, a first output sub-circuit 2; in particular, the shifter register in the embodiment of the present disclosure further includes a first noise reduction sub-circuit 3 and/or a second noise reduction sub-circuit 4. The input sub-circuit 1 is configured to pre-charge, in response to an input signal, a pull-up node PU by a first power voltage; the pull-up node PU is a coupling node at which the input sub-circuit 1 and the output sub-circuit are coupled; the first output sub-circuit 2 is configured to output a clock signal through a first signal output terminal Output in response to a potential of the pull-up node PU; the first noise reduction sub-circuit 3 is configured to perform noise reduction on the pull-up node PU by a non-operation level signal in a blank period in response to a first noise reduction control signal; the second noise reduction sub-circuit 4 is configured to perform noise reduction on the first signal output terminal Output by a low-level signal in the blank period in response to a second noise reduction control signal.

Since the shift register of the embodiment of the present disclosure includes the first noise reduction sub-circuit 3 and the second noise reduction sub-circuit 4, and in the blank period, the first noise reduction sub-circuit 3 can reduce noise of the pull-up node PU under the control of the first noise reduction control signal, and the second noise reduction sub-circuit 4 can reduce noise of the first signal output terminal Output under the control of the second noise reduction control signal, and thus the output stability of the shift register in the blank period can be ensured, thereby avoiding the influence of noise on the display of a next frame of picture.

It should be noted that the shift register in the embodiment of the present disclosure may include only one of the first noise reduction sub-circuit 3 and the second noise reduction sub-circuit 4, but it should be understood that, in order to ensure the stable output of the shift register to the maximum extent, in some implementations, the shift register includes both the first noise reduction sub-circuit 3 and the second noise reduction sub-circuit 4. For convenience of description in the embodiment of the present disclosure, the shift register is described by taking an example in which the shift register includes both the first noise reduction sub-circuit 3 and the second noise reduction sub-circuit 4, but this is not a limitation to the embodiment of the present disclosure.

Figure 2:
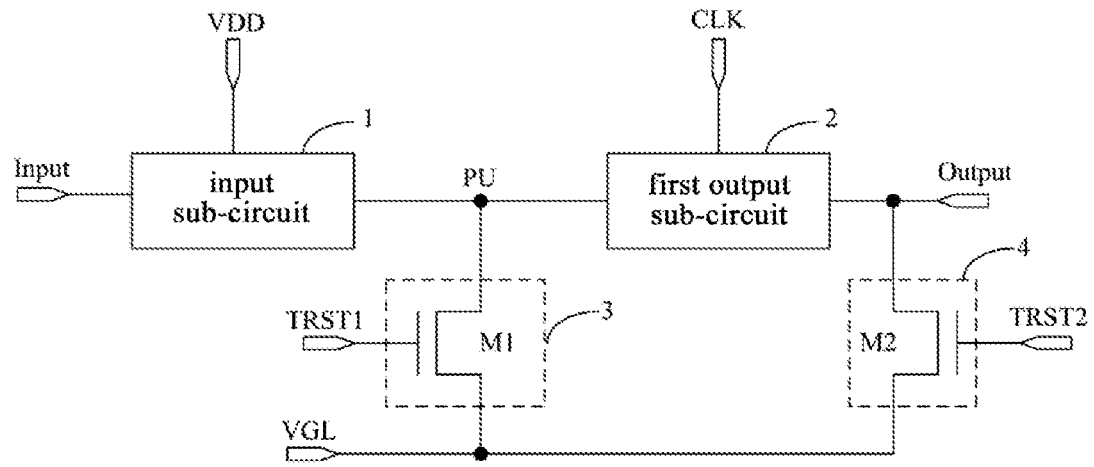
FIG. 2 is a schematic structural diagram of a shift register according to another embodiment of the present disclosure.

In some implementations, as shown in FIG. 2, the first noise reduction sub-circuit 3 includes a first transistor M1; the second noise reduction sub-circuit 4 includes a second transistor M2, A source of the first transistor M1 is coupled to the pull-up node PU, a drain of the first transistor M1 is coupled to a low-level signal terminal VGL, and a gate of the first transistor M1 is coupled to a first noise reduction control signal terminal TRST1. A source of the second transistor M2 is coupled to the first signal output terminal Output, a drain of the second transistor M2 is coupled to the low-level signal terminal VGL, and a gate of the second transistor M2 is coupled to a second noise reduction control signal terminal TRST2.

It should be noted that, since the first noise reduction sub-circuit 3 and the second noise reduction sub-circuit 4 both operate in the blank period, the first noise reduction control signal and the second noise reduction control signal are the same, and therefore, the first noise reduction control signal terminal TRST1 and the second noise reduction control signal terminal TRST2 may be a same signal terminal.

Specifically, in the blank period, a high-level signal is input to the first noise reduction control signal terminal TRST1 and the second noise reduction control signal terminal TRST2, at this time, the first transistor M1 and the second transistor M2 are turned on, and a low-level signal written from the low-level signal terminal VGL pulls down the pull-up node PU through the first transistor M1, so as to reduce noise of the pull-up node PU; similarly, the low-level signal written from the low-level signal terminal VGL pulls down the output of the first signal output terminal Output through the second transistor M2, so as to reduce noise of the first signal output terminal Output.

Figure 3:
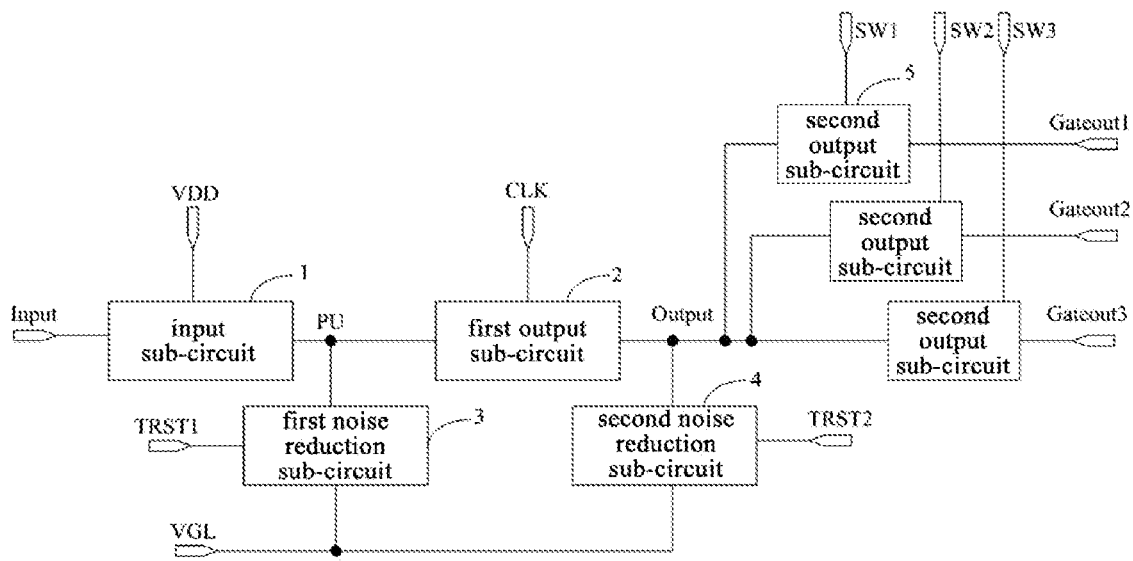
FIG. 3 is a schematic structural diagram of a shift register according to another embodiment of the present disclosure.

In some implementations, as shown in FIG. 3, the shift register includes not only the above-described structures but also a plurality of second output sub-circuits 5.

Figure 4:
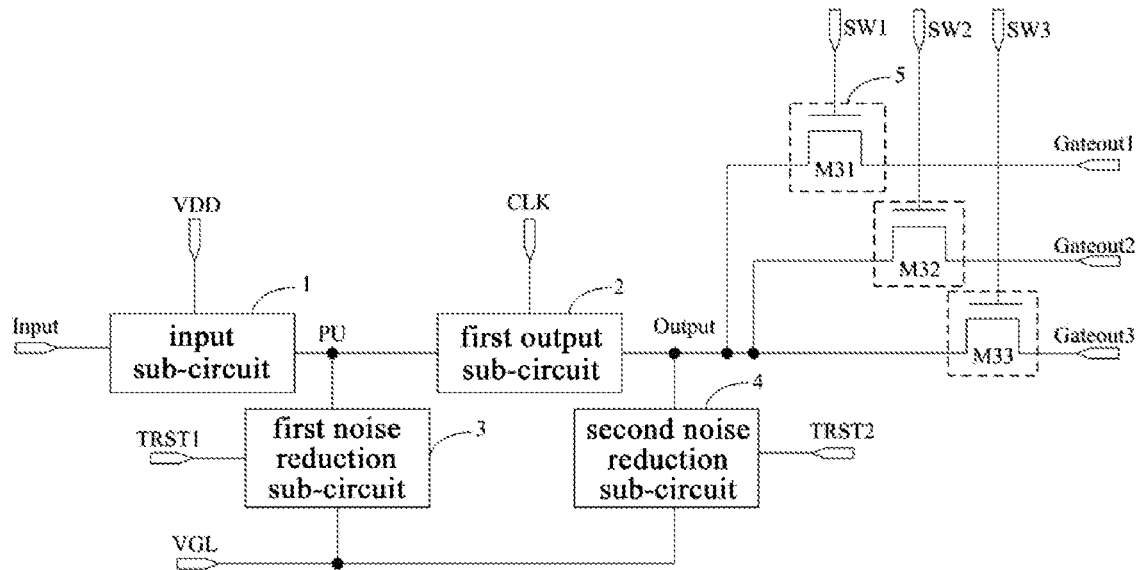
FIG. 4 is a schematic structural diagram of a shift register according to another embodiment of the present disclosure.

In an example, as shown in FIG. 4, each of the plurality of second output sub-circuits 5 is configured to output a signal output from the first signal output terminal Output through a second signal output terminal in response to a switch control signal. Thus, scanning signals can be output for a plurality of gate lines through one shift register, thereby being beneficial to realizing a narrow bezel of the display panel.

Specifically, a case where the shift register includes three second output sub-circuits 5 is taken as an example. Each of the second output sub-circuits 5 may include a third transistor; the three second output sub-circuits 5 are respectively coupled with three second signal output terminals and three switch control signal terminals in one-to-one correspondence; third transistors in the three second output sub-circuits 5 are respectively denoted by M31, M32, M33; the three second signal output terminals are respectively denoted by Gateout1, Gateout2 and Gateout3; the three switch control signal terminals are respectively denoted by SW1, SW2 and SW3; sources of the transistors M31, M32 and M33 are all coupled to the first signal output terminal, a drain of the transistor M31 is coupled to Gateout1, and a gate of the transistor M31 is coupled to the switch control signal terminal SW1, a drain of the transistor M32 is coupled to the second signal output terminal Gateout2, and a gate of the transistor M32 is coupled with the switch control signal terminal SW2; a drain of the transistor M33 is coupled to the second signal output terminal Gateout3, and a gate of the transistor M33 is coupled to the switch control signal terminal SW3.

When the first output sub-circuit 2 outputs a clock signal (a high-level signal) through the first signal output terminal Output under the control of the pull-up node PU, firstly, the switch control signal terminal SW1 controls the transistor M31 to be turned on, and the second signal output terminal Gateout1 outputs a high-level signal; next, the switch control signal terminal SW2 controls the transistor M32 to be turned on, and the second signal output terminal Gateout2 outputs a high-level signal; finally, the switch control signal terminal SW3 controls the transistor M33 to be turned on, and the second signal output terminal Gateout3 outputs a high-level signal. It should be understood that the second signal output terminals Gateout1, Gateout2, Gateout3 are coupled to three gate lines in the display panel one to one.

Figure 5:
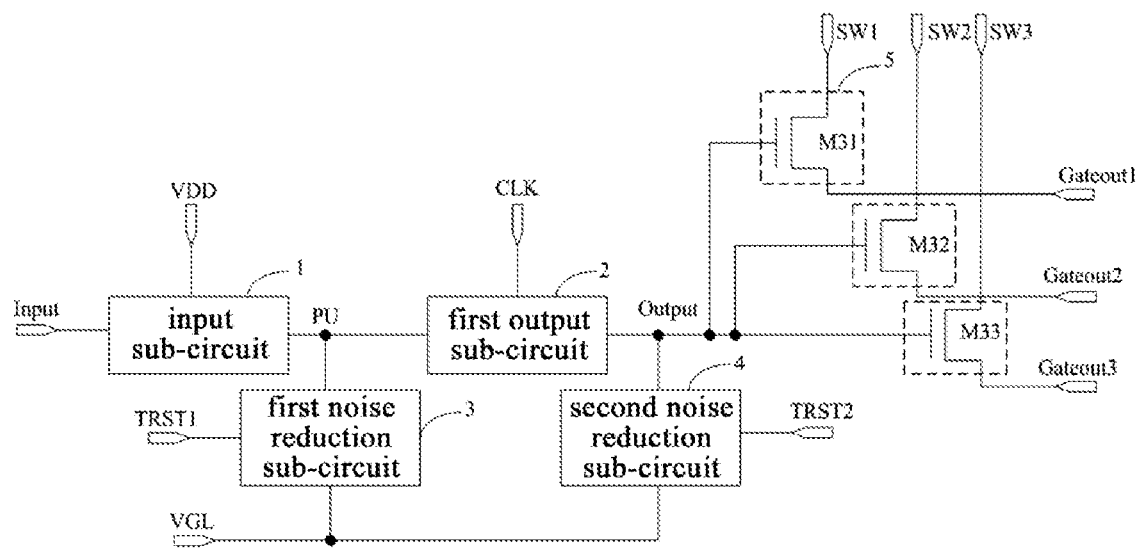
FIG. 5 is a schematic structural diagram of a shift register according to another embodiment of the present disclosure.

In another example, as shown in FIG. 5, each of the plurality of second output sub-circuits 5 is configured to output a signal output from a driving signal terminal through the second signal output terminal (e.g., Gateout1, Gateout2, Gateout3) in response to the signal output from the first signal output terminal Output. Thus, scanning signals can be output for a plurality of gate lines through one shift register, thereby being beneficial to realizing a narrow bezel of the display panel.

Specifically, a case where the shift register includes three second output sub-circuits 5 is taken as an example. Each of the second output sub-circuits 5 may include a third transistor; the three second output sub-circuits 5 are coupled with three second signal output terminals and three switch control signal terminals, respectively; third transistors in the three second output sub-circuits 5 are respectively denoted by M31, M32, M33, the three second signal output terminals are respectively denoted by Gateout1, Gateout2 and Gateout3; three switch control signal terminals are respectively denoted by SW1, SW2 and SW3; gates of the transistors M31, M32 and M33 are all coupled to the first signal output terminal Output, a drain of the transistor M31 is coupled to the second signal output terminal Gateout1, and a source of the transistor M31 is coupled to the switch control signal terminal SW1; a drain of the transistor M32 is coupled with the second signal output terminal Gateout2, and a source of the transistor M32 is coupled with the switch control signal terminal SW2; a drain of the transistor M33 is coupled to the second signal output terminal Gateout3, and a source of the transistor M33 is coupled to the switch control signal terminal SW3.

When the first output sub-circuit 2 outputs a clock signal (a high-level signal) through the first signal output terminal Output under the control of the pull-up node PU, the transistors M31, M32, and M33 are all turned on, first, a high-level signal is written into the switch control signal terminal SW1, so that the second signal output terminal Gateout1 outputs a high-level signal; next, a high-level signal is written into the switch control signal SW2, and the second signal output terminal Gateout2 outputs a high-level signal; finally, a high-level signal is written into the switch control signal terminal SW3, and the second signal output terminal Gateout3 outputs a high-level signal. It should be understood that the second signal output terminals Gateout1, Gateout2 and Gateout3 are coupled to three gate lines in the display panel one to one.

Figure 6:
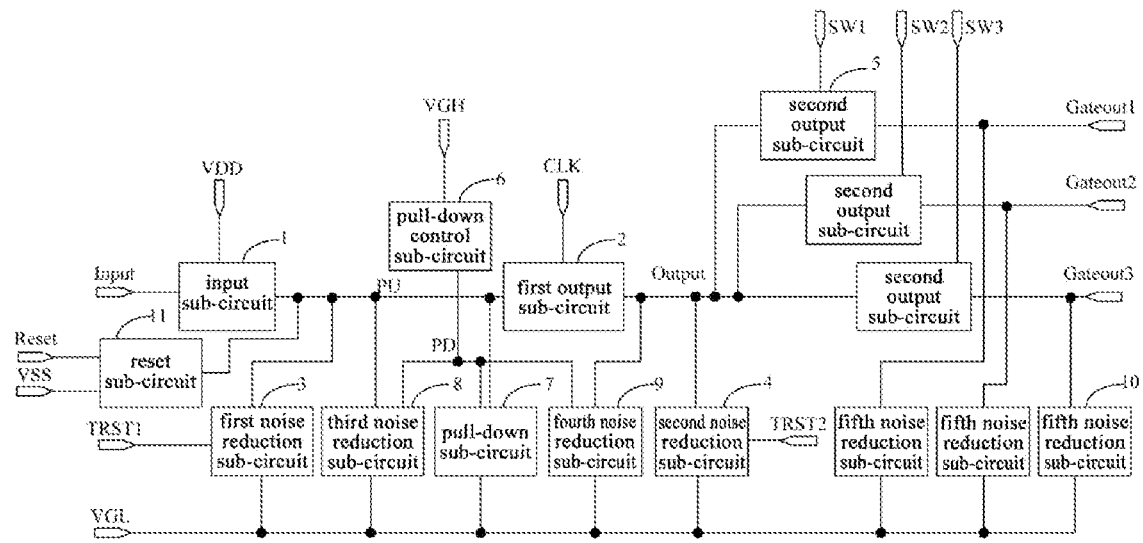
FIG. 6 is a schematic structural diagram of a shift register according to another embodiment of the present disclosure.

In some implementations, as shown in FIG. 6, the shift register includes not only the above-described structures, but also a pull-down control sub-circuit 6, a pull-down sub-circuit 7, a third noise reduction sub-circuit 8, and a fourth noise reduction sub-circuit 9. The pull-down control sub-circuit 6 is configured to, in response to a high-level signal, transmit the high-level signal to a pull-down node PD, which is a coupling node at which the pull-down control sub-circuit 6 and the pull-down sub-circuit 7 are coupled; the pull-down sub-circuit 7 is configured to pull down a potential of the pull-down node PD by a low-level signal in response to the potential of the pull-up node PU; the third noise reduction sub-circuit 8 is configured to reduce noise of the pull-up node PU by a low-level potential in response to the potential of the pull-down node PD; the fourth noise reduction sub-circuit 9 is configured to reduce noise of the first signal output terminal Output by a low-level signal in response to the potential of the pull-down node PD.

Figure 7:
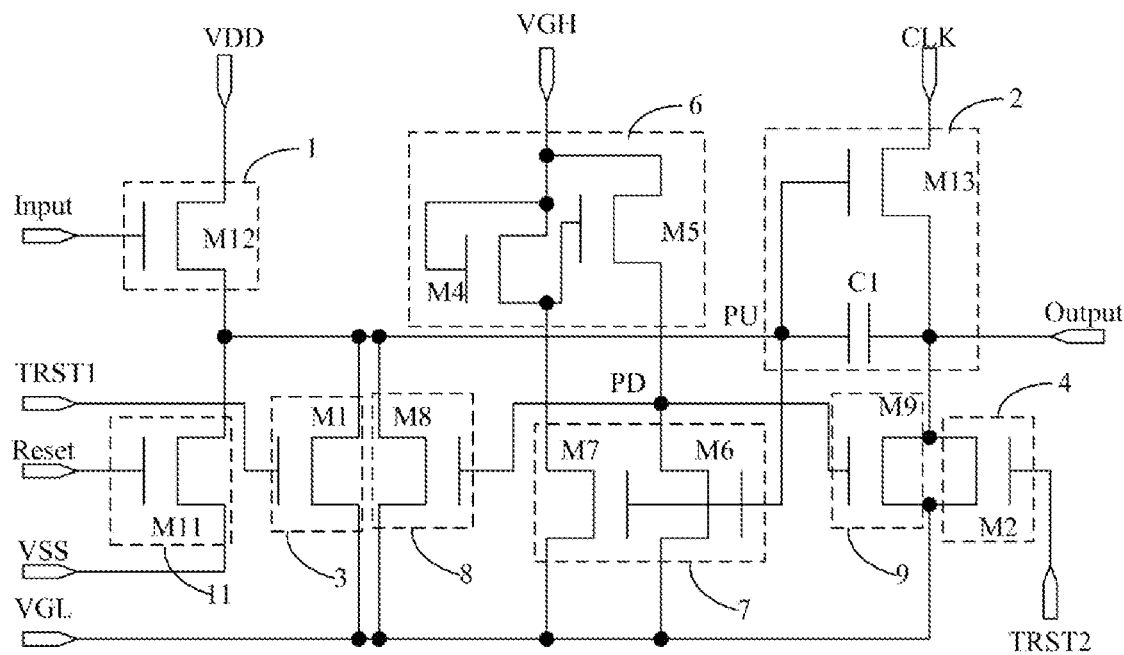
FIG. 7 is a circuit diagram of a shift register according to an embodiment of the present disclosure.
Figure 9:
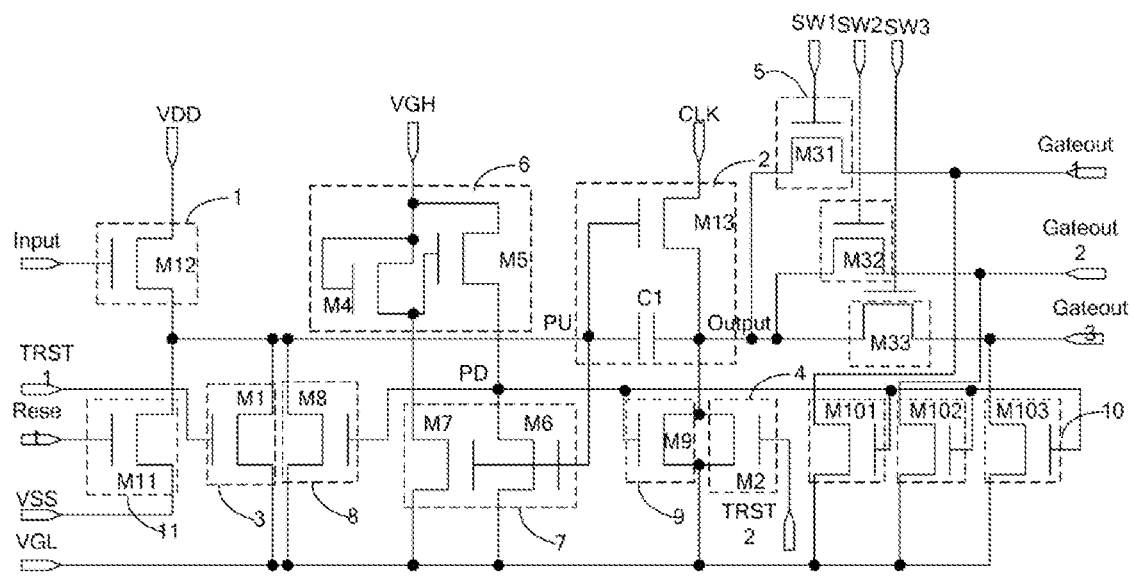
FIG. 9 is a circuit diagram of a shift register according to another embodiment of the present disclosure.
Figure 11:
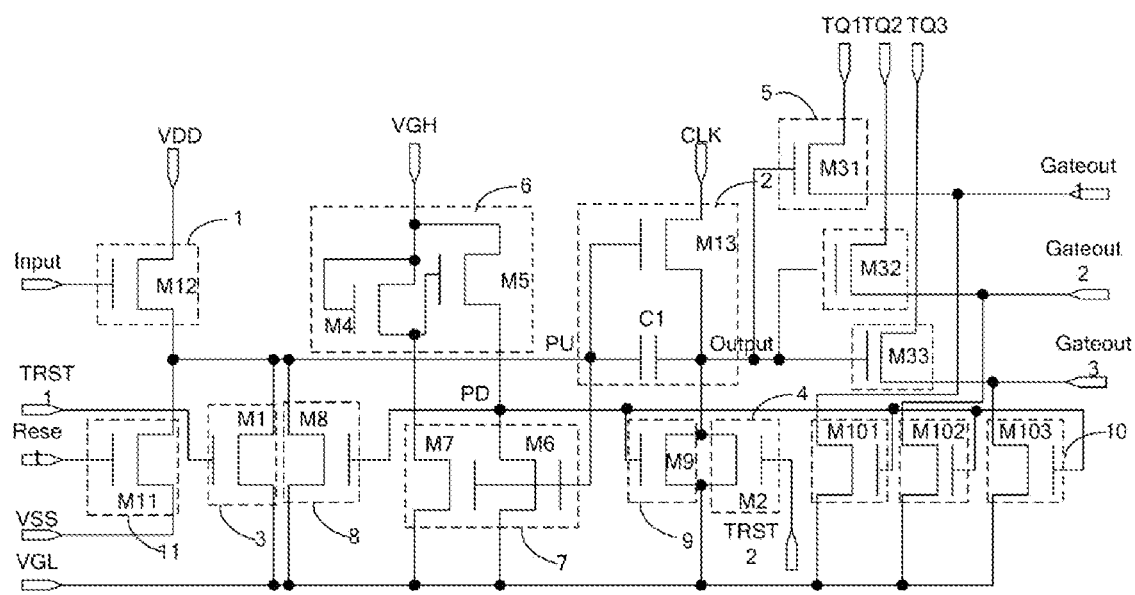
FIG. 11 is a circuit diagram of a shift register according to an embodiment of the present disclosure.

Specifically, as shown in FIGS. 7, 9 and 11, the pull-down control sub-circuit 6 may include a fourth transistor M4 and a fifth transistor M5; the pull-down sub-circuit 7 may include a sixth transistor M6 and a seventh transistor M7; the third noise reduction sub-circuit 8 may include an eighth transistor M8; the fourth noise reduction sub-circuit 9 may include a ninth transistor M9. A source of the fourth transistor M4 is coupled to a gate thereof, a source of the fifth transistor M5 and a high-level signal terminal VGH, and a drain of the fourth transistor M4 is coupled to a source of the seventh transistor M7 and a gate of the fifth transistor M5; a drain of the fifth transistor M5 is coupled to the pull-down node PD; a source of the sixth transistor M6 is coupled to the pull-down node RD, a drain of the sixth transistor M6 is coupled to the low-level signal terminal VOL, and a gate of the sixth transistor M6 is coupled to the pull-up node PU; a drain of the seventh transistor M7 is coupled to the low-level signal terminal VOL, and a gate of the seventh transistor M7 is coupled to the pull-up node PU; a source of the eighth transistor M8 is coupled to the pull-down node PU, a drain of the eighth transistor M8 is coupled to the low-level signal terminal VOL, and a gate of the eighth transistor M8 is coupled to the pull-down node PD; a source of the ninth transistor M9 is coupled to the first signal output terminal Output, a drain of the ninth transistor M9 is coupled to the low-level signal terminal VOL, and a gate of the ninth transistor M9 is coupled to the pull-down node PD.

When a certain stage of shift register outputs a high-level signal, the pull-up node PU is at a high-level potential, at this time, the sixth transistor M6 and the seventh transistor M7 are turned on, and a low-level signal input through the low-level signal terminal VOL pulls down the potential of the pull-down node PD, so as to prevent the eighth transistor M8 and the ninth transistor M9 from being turned on to affect the stability of the output of the pull-up node PU and the first signal output terminal Output.

When a certain stage of shift register outputs a low-level signal, the pull-up node PU is at a low-level potential, the high-level signal input from the high-level signal terminal VGH controls the fourth transistor M4 and the fifth transistor M5 to be turned on, and the potential of the pull-down node PD is pulled up by the high-level signal, so that the eighth transistor M8 and the ninth transistor M9 are turned on, the low-level signal input by the low-level signal terminal VGL performs noise reduction on the pull-up node PU through the eighth transistor M8, and performs noise reduction on the first signal output terminal Output through the ninth transistor M9.

In some implementations, as shown in FIG. 6, the shift register may include not only the above-described structures, but also a plurality of fifth noise reduction sub-circuits 10 provided in one-to-one correspondence with the second signal output terminals; each of the plurality of fifth noise reduction sub-circuits 10 performs, in response to the potential of the pull-down node PD, noise reduction on the second signal output terminal corresponding thereto by a low-level signal.

Specifically, as shown in FIGS. 9 and 11, a case where the shift register includes three second output sub-circuits 5 is also taken as an example, and three second signal output terminals correspondingly coupled to the three second output sub-circuits 5 are Gateout1, Gateout2, and Gateout3, respectively. Each fifth noise reduction sub-circuit 10 may include a tenth transistor; tenth transistors in the three fifth noise reduction sub-circuits 10 are denoted by M101, M102, M103, respectively. Gates of the tenth transistors M101, M102 and M103 are all coupled with the pull-down node PD, a source of the tenth transistor M101 is coupled with the second signal output terminal Gateout1, a source of the tenth transistor M102 is coupled with the second signal output terminal Gateout2, a source of the tenth transistor M103 is coupled with the second signal output terminal Gateout3, and drains of the tenth transistors M101, M102 and M103 are coupled with the low-level signal terminal VGL.

When the shift register outputs a low-level signal, the second signal output terminals Gateout1, Gateout2 and Gateout3 output a low-level signal, the pull-up node PU is at a low-level, the pull-down node PD is pulled up by a high-level signal input from the high-level signal terminal VGH, at this time, the transistors M101, M102, M103 are all turned on, and the low-level signal input from the low-level signal terminal VGL performs noise reduction on the second signal output terminals Gateout1, Gateout2 and Gateout3 by the transistors M101, M102, and M103, respectively.

In some implementations, the shift register not only includes the above-described structure, but also includes a reset sub-circuit 11, and the reset sub-circuit 11 is configured to reset the potential of the pull-up node PU by a low-level signal in response to a reset signal.

In some implementations, as shown in FIGS. 9 and 11, the reset sub-circuit 11 in the embodiment of the present disclosure may include an eleventh transistor M11; a source of the eleventh transistor M11 is coupled to the pull-up node PU, a drain of the eleventh transistor M11 is coupled to a second power voltage terminal VSS, and a gate of the eleventh transistor M11 is coupled to a reset signal terminal Reset.

Specifically, in a reset stage, the reset signal terminal Reset is written with a high-level signal, the eleventh transistor M11 is turned on, and the potential of the pull-up node PU is reset by the low power voltage written by the second power voltage terminal VSS.

In some implementations, as shown in FIGS. 7, 9 and 11, the input sub-circuit 1 of the shift register may include a twelfth transistor M12. A source of the twelfth transistor M12 is coupled to a first power voltage terminal VDD, a drain of the twelfth transistor M12 is coupled to the pull-up node PU, and a gate of the twelfth transistor M12 is coupled to a signal input terminal Input.

Specifically, in an input stage, a high-level signal is input to the signal input terminal Input, the twelfth transistor M12 is turned on, the pull-up node PU is pre-charged by the high power voltage written to the first power voltage terminal VDD through the twelfth transistor M12.

In some implementations, as shown in FIGS. 7, 9 and 11, the first output sub-circuit 2 of the shift register may include a thirteenth transistor M13 and a storage capacitor C1. A source of the thirteenth transistor M13 is coupled to a clock signal terminal CLK, and a drain of the thirteenth transistor M13 is coupled to the first signal output terminal Output and a second terminal of the storage capacitor C1; a gate of the thirteenth transistor M13 is coupled to the pull-up node PU and a first terminal of the storage capacitor C1.

Specifically, since the pull-up node PU is pre-charged and pulled up in the input stage and such state is stored in the storage capacitor C1, in an output stage, the twelfth transistor M12 is turned off, the clock signal terminal CLK inputs a high-level signal, the high-level signal is written into the second terminal of the storage capacitor C1, the potential of the pull-up node PU is further pulled up by bootstrap effect of the storage capacitor C1, the thirteenth transistor M13 is turned on, and the first signal output terminal Output outputs the high-level signal written by the clock signal terminal CLK.

In order to clarify the structure of the shift register in the embodiment of the present disclosure, the structure and the operation process of the embodiment of the present disclosure are explained by the following specific examples.

As a first specific example, as shown in FIG. 7, the shift register includes an input sub-circuit 1, a first output sub-circuit 2, a reset sub-circuit 11, a pull-down control sub-circuit 6, a pull-down sub-circuit 7, a first noise reduction sub-circuit 3, a second noise reduction sub-circuit 4, a third noise reduction sub-circuit 8, and a fourth noise reduction sub-circuit 9. The input sub-circuit 1 includes a twelfth transistor M12; the first output sub-circuit 2 includes a thirteenth transistor M13 and a storage capacitor C1; the reset sub-circuit 11 includes an eleventh transistor M11; the pull-down control sub-circuit 6 includes a fourth transistor M4 and a fifth transistor M5; the pull-down sub-circuit 7 includes a sixth transistor M6 and a seventh transistor M7; the first noise reduction sub-circuit 3 includes a first transistor M1; the second noise reduction sub-circuit 4 includes a second transistor M2; the third noise reduction subcircuits includes an eighth transistor M8; the fourth noise reduction sub-circuit 9 includes a ninth transistor M9.

Specifically, a source of the twelfth transistor M12 is coupled to a first power voltage terminal VDD, a drain of the twelfth transistor M12 is coupled to a pull-up node PU, and a gate of the twelfth transistor M12 is coupled to a signal input terminal Input; a source of the thirteenth transistor M13 is coupled to a clock signal terminal CLK, and a drain of the thirteenth transistor M13 is coupled to a first signal output terminal Output and a second terminal of the storage capacitor C1; a gate of the thirteenth transistor M13 is coupled to the pull-up node PU and a first terminal of the storage capacitor C1; a source of the eleventh transistor M11 is coupled to the pull-up node PU, a drain of the eleventh transistor M11 is coupled to a second power voltage terminal VSS, and a gate of the eleventh transistor M11 is coupled to a reset signal terminal Reset; a source of the fourth transistor M4 is coupled to a gate thereof; a source of the fifth transistor M5 and the high-level signal terminal VGH, and a drain of the fourth transistor M4 is coupled to a source of the seventh transistor M7 and a gate of the fifth transistor M5; a source of the fifth transistor M5 is coupled to the pull-down node PD; a source of the sixth transistor M6 is coupled to the pull-down node PD, a drain of the sixth transistor M6 is coupled to the low-level signal terminal VGL, and a gate of the sixth transistor M6 is coupled to the pull-up node PU; a drain of the seventh transistor M7 is coupled to the low-level signal terminal VGL, and a gate of the seventh transistor M7 is coupled to the pull-up node PU; a source of the eighth transistor M8 is coupled to the pull-down node PU; a drain of the eighth transistor M8 is coupled to the low-level signal terminal VGL, and a gate of the eighth transistor M8 is coupled to the pull-down node PD; a source of the ninth transistor M9 is coupled to the first signal output terminal Output, a drain of the ninth transistor M9 is coupled to the low-level signal terminal VGL, and a gate of the ninth transistor M9 is coupled to the pull-down node PD; a source of the first transistor M1 is coupled to the pull-up node PU, a drain of the first transistor M1 is coupled to the low-level signal terminal VGL, and a gate of the first transistor is coupled to a first noise reduction control signal terminal TRST1; a source of the second transistor M2 is coupled to the first signal output terminal Output, a drain of the second transistor M2 is coupled to the low-level signal terminal VGL, and a gate of the second transistor M2 is coupled to a second noise reduction control signal terminal TRST2.

Figure 8:
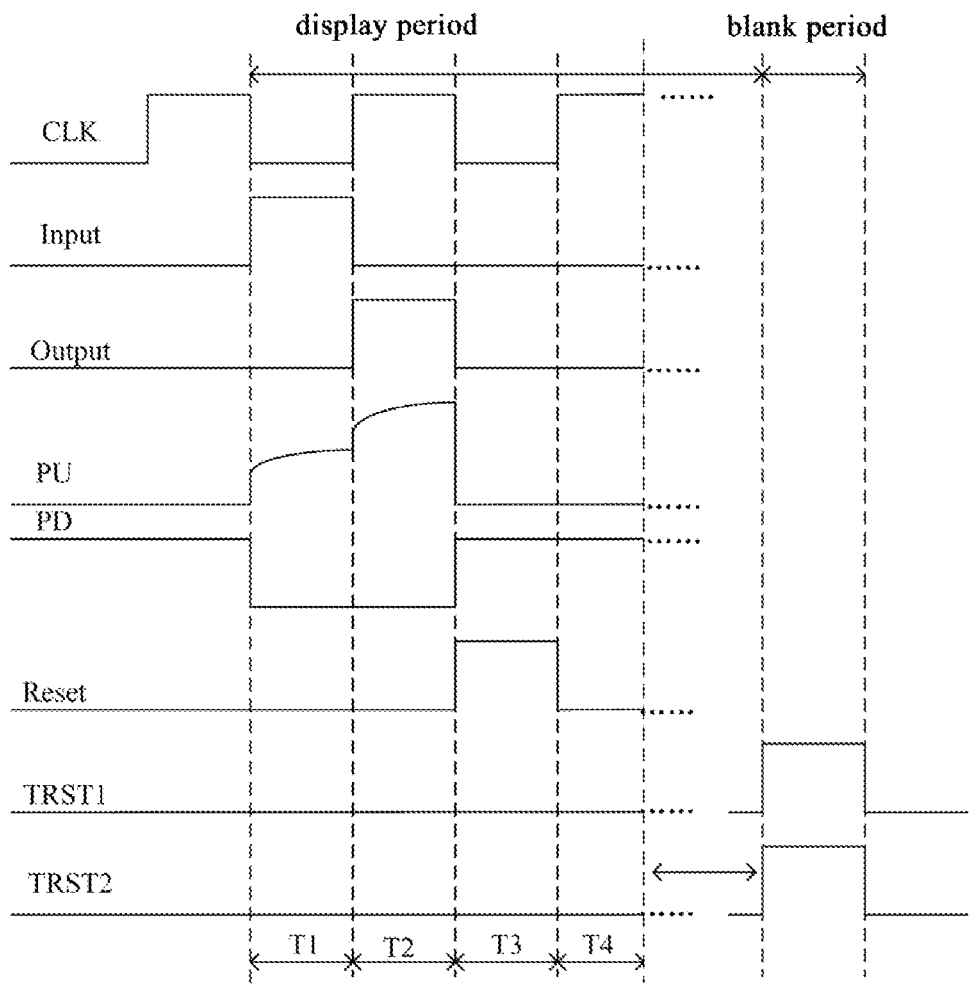
FIG. 8 is a timing diagram illustrating operation of the shift register of FIG. 7.

In conjunction with the timing diagram shown in FIG. 8, how a shift register operates in a display period of a frame of picture and in the blank period between display periods of two adjacent frames of pictures will be described, so that the shift register of the embodiment of the present disclosure is more clearly understood.

In the display stage of the frame of picture; a driving method of the shift register specifically includes the following stages T1 to T4.

At a first stage (T1), i.e., an input stage, the input signal terminal is written with a high-level signal, the twelfth transistor M12 is turned on, and the clock signal written by the clock signal terminal CLK is a low-level signal, the high power voltage of the first power voltage terminal VDD charges the storage capacitor C1 through the twelfth transistor M12, so that the voltage of the pull-up node PU is pulled up; at this stage, since the pull-up node PU is at a high-level, the sixth transistor M6 and the seventh transistor M7 are turned on, and the pull-down node PD is pulled down by a low-level signal written by the low power voltage terminal, so that the eighth transistor M8 and the ninth transistor M9 are kept turned off, and the first signal output terminal Output outputs a stable low-level signal.

At a second stage (T2), i.e., an output stage, the input signal terminal is written with a low-level signal, the twelfth transistor M12 is turned off, the pull-up node PU keeps at the high-level potential of the first stage, and the thirteenth transistor M13 keeps being turned on; at this time, the clock signal terminal CLK writes a high-level signal, and the voltage of the pull-up node PU is amplified due to a bootstrap effect of the storage capacitor C1, so as to ensure that the thirteenth transistor M13 is continuously turned on, so that the first signal output terminal outputs a high-level signal; at this time, since the pull-up node PU is at a high-level, the sixth transistor M6 and the seventh transistor M7 are continuously turned on, and the pull-down node PD is pulled down by the low-level signal written by the low power voltage terminal, so that the eighth transistor M8 and the ninth transistor M9 are continuously kept turned off, and the first signal output terminal Output outputs a stable high-level signal.

At a third stage (T3), i.e., a reset stage, the reset signal terminal Reset is written with a high-level signal, the eleventh transistor M11 is turned on, the second power voltage terminal VSS is written with a low power voltage signal to pull down the potential of the pull-up node PU, and at this time, the thirteenth transistor M13, the sixth transistor M6 and the seventh transistor M7 are turned off; the high-level signal inputted from the high-level signal terminal Val turns on the fourth transistor M4 and the fifth transistor M5, and pulls up the potential of the pull-down node PD, so that the eighth transistor M8 and the ninth transistor M9 are turned on, the low-level signal inputted from the low-level signal terminal VGL pulls down the pull-up node PU through the eighth transistor M8, and pulls down the first signal output terminal Output through the ninth transistor M9.

At a fourth stage (T4), i.e., a noise reduction stage, the twelfth transistor M12 is always turned off, a high-level signal input by the high-level signal terminal VGH controls the fourth transistor M4 and the fifth transistor M5 to be turned on, so that the pull-down node PD is always at a high-level potential, the eighth transistor M8 and the ninth transistor M9 are turned on, a low-level signal input by the low-level signal terminal VGL performs noise reduction on the pull-up node PU through the eighth transistor M8, and performs noise reduction on the first signal output terminal Output through the ninth transistor M9, at this time, a coupling noise voltage generated by the clock signal terminal CLK can be eliminated, so that output of a low-level signal of the first signal output terminal Output is realized, and stability of signal output is ensured.

Before the next frame of picture comes, the shift register repeats the fourth stage, and the noise reduction is continuously performed on the shift register. A period from an end of the current frame of picture to a start of the next frame of picture is the blank period.

At the blank stage, the first noise reduction control signal terminal TRST1 and the second noise reduction control signal terminal TRST2 are written with high-level signals, the first transistor M1 and the second transistor M2 are turned on, a low-level signal input by the low-level signal terminal VGL reduces noise of the pull-up node PU through the first transistor M1, and reduces noise of the first signal output terminal Output through the second transistor M2, so that when the next frame of picture is displayed, the shift register can stably operate, and the influence of noise on a displayed picture is effectively avoided.

A second specific example: as shown in FIG. 9, the shift register includes a input sub-circuit 1, a first output sub-circuit 2, a plurality of second output sub-circuits 5, a reset sub-circuit 11, a pull-down control sub-circuit 6, a pull-down sub-circuit 7, a first noise reduction sub-circuit 3, a second noise reduction sub-circuit 4, a third noise reduction sub-circuit 8, a fourth noise reduction sub-circuit 9, and three fifth noise reduction sub-circuits 10 provided in one-to-one correspondence with the three second output sub-circuits 5, The input sub-circuit 1 includes a twelfth transistor M12; the first output sub-circuit 2 includes a thirteenth transistor M13 and a storage capacitor C1; each second output sub-circuit 5 includes a third transistor; the reset sub-circuit 11 includes an eleventh transistor M11; the pull-down control sub-circuit 6 includes a fourth transistor M4 and a fifth transistor M5; the pull-down sub-circuit 7 includes a sixth transistor M6 and a seventh transistor M7; the first noise reduction sub-circuit 3 includes a first transistor M1; the second noise reduction sub-circuit 4 includes a second transistor M2; the third noise reduction sub-circuit 8 includes an eighth transistor M8; the fourth noise reduction sub-circuit 9 includes a ninth transistor M9, and each of the fifth noise reduction sub-circuits 10 includes a tenth transistor. Three third transistors are respectively represented by M31, M32 and M33, and three tenth transistors are respectively represented by M101, M102 and M103; three second signal output terminals corresponding to the three third transistors are Gateout1, Gateout2 and Gateout3 respectively, and three switch control signal terminals are SW1, SW2 and SW3 respectively.

Specifically, a source of the twelfth transistor M12 is coupled to a first power voltage terminal VDD, a drain of the twelfth transistor M12 is coupled to the pull-up node PU, and a gate of the twelfth transistor M12 is coupled to the signal input terminal Input; a source of the thirteenth transistor M13 is coupled to a clock signal terminal CLK, and a drain of the thirteenth transistor M13 is coupled to the first signal output terminal Output and a second terminal of the storage capacitor C1; a gate of the thirteenth transistor M13 is coupled to the pull-up node PU and a first terminal of the storage capacitor C1; sources of the third transistors M31, M32 and M33 are all coupled with the first signal output terminal Output, a drain of the third transistor M31 is coupled with the second signal output terminal Gateout1, and a gate of the third transistor M31 is coupled with the switch control signal terminal SW1; a drain of the third transistor M32 is coupled with the second signal output terminal Gateout2, and a gate of the third transistor M32 is coupled with the switch control signal terminal SW2; a drain of the third transistor M33 is coupled with the second signal output terminal Gateout3, and a gate of the third transistor M33 is coupled with the switch control signal terminal SW3; a source of the eleventh transistor M11 is coupled to the pull-up node PU, a drain of the eleventh transistor M11 is coupled to the second power voltage terminal VSS, and a gate of the eleventh transistor M11 is coupled to the reset signal terminal Reset; a source of the fourth transistor M4 is coupled to a gate thereof, a source of the fifth transistor M5 and a high-level signal terminal VGH, and a drain of the fourth transistor M4 is coupled to a source of the seventh transistor M7 and a gate of the fifth transistor M5; the source of the fifth transistor M5 is coupled to the pull-down node PD; a source of the sixth transistor M6 is coupled to the pull-down node PD, a drain of the sixth transistor M6 is coupled to the low-level signal terminal VGL, and a gate of the sixth transistor M6 is coupled to the pull-up node PU; a drain of the seventh transistor M7 is coupled to the low-level signal terminal VGL, and a gate is coupled to the pull-up node PU; a source of the eighth transistor M8 is coupled to the pull-down node PU, a drain of the eighth transistor M8 is coupled to the low-level signal terminal VGL, and a gate of the eighth transistor M8 is coupled to the pull-down node PD; a source of the ninth transistor M9 is coupled to the first signal output terminal Output, a drain of the ninth transistor M9 is coupled to the low-level signal terminal VGL, and a gate of the ninth transistor M9 is coupled to the pull-down node PD; a source of the first transistor M1 is coupled to the pull-up node PU, a drain of the first transistor M1 is coupled to the low-level signal terminal VGL, and a gate of the first transistor 1 is coupled to the first noise reduction control signal terminal TRST1; a source of the second transistor M2 is coupled to the first signal output terminal Output, a drain of the second transistor M2 is coupled to the low-level signal terminal VGL, and a gate of the second transistor M2 is coupled to the second noise reduction control signal terminal TRST2; gates of the third transistors M101, M102 and M103 are all coupled with the pull-down node PD, a source of the third transistor M101 is coupled with the second signal output terminal Gateout1, the source of the third transistor M2 is coupled with the second signal output terminal Gateout2, the source of the third transistor M103 is coupled with the second signal output terminal Gateout3, and drains of the third transistors M101, M102 and M103 are coupled with the low-level signal terminal VGL.

It should be noted that the number of the second output sub-circuits 5 in the embodiment of the present disclosure is not limited to three, and may be specifically set according to specific situations.

Figure 10:
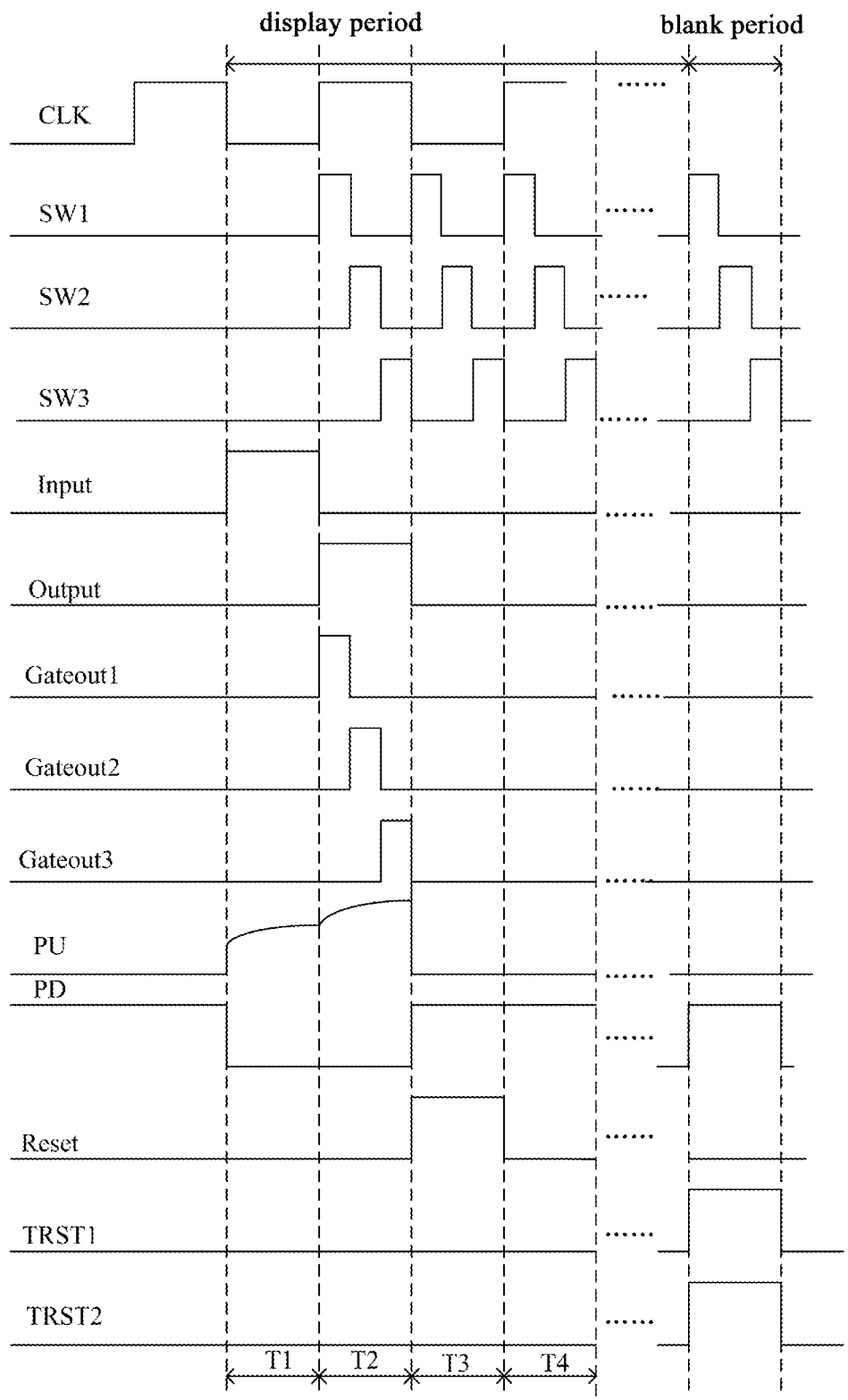
FIG. 10 is a timing diagram illustrating operation of the shift register of FIG. 9.

In conjunction with the timing diagram shown in FIG. 10, how a shift register unit operates in the display period of a frame of picture and in the blank period between the display periods of two adjacent frames of pictures will be described so that the shift register of the embodiment of the present disclosure is more clearly understood.

In the display stage of the frame of picture, the driving method of the shift register specifically includes the following stages T1 to T4.

At a first stage (T1), i.e., an input stage, the input signal terminal is written with a high-level signal, the twelfth transistor M12 is turned on, and a clock signal written by the clock signal terminal CLK is a low-level signal, a high power voltage of the first power voltage terminal VDD charges the storage capacitor C1 through the twelfth transistor M12, so that the voltage of the pull-up node PU is pulled up; at this stage, since the pull-up node PU is at a high-level, the sixth transistor M6 and the seventh transistor M7 are turned on, and the pull-down node PD is pulled down by a low-level signal written by the low power voltage terminal, so that the eighth transistor M8, the ninth transistor M9, and the tenth transistors M101, M102, and M103 are kept turned off, and the first signal output terminal Output outputs a stable low-level signal.

At a second stage (T2), i.e., an output stage, the input signal terminal is written with a low-level signal, the twelfth transistor M12 is turned off, the pull-up node PU keeps at the high-level potential of the first stage, and the thirteenth transistor M13 keeps turned on; at this time, the clock signal terminal UK writes a high-level signal, and the voltage of the pull-up node PU is amplified due to a bootstrap effect of the storage capacitor C1, so as to ensure that the thirteenth transistor M13 is continuously turned on, so that the first signal output terminal outputs a high-level signal; at this time, since the pull-up node PU is at a high-level, the sixth transistor M6 and the seventh transistor M7 are continuously turned on, and the pull-down node PD is pulled down by a low-level signal written by the low power voltage terminal, so that the eighth transistor M8, the ninth transistor M9, and the tenth transistors M101, M102, and M103 are continuously kept turned off, and the first signal output terminal Output outputs a stable high-level signal; meanwhile, firstly, a high-level signal is written into the switch control signal terminal SW1, the third transistor M31 is turned on, low-level signals are written into the switch control signal terminals SW2 and SW3, the third transistor M32 and the third transistor M33 are kept turned off, and only the second signal output terminal Gateout1 outputs the high-level signal output by the first signal output terminal Output; next, the switch control signal terminal SW2 is written with a high-level signal, the third transistor M32 is turned on, the switch control signal terminals SW1 and SW3 are written with low-level signals, the third transistor M31 and the third transistor M33 remain turned off, and only the second signal output terminal Gateout2 outputs the high-level signal output by the first signal output terminal Output; the switch control signal terminal SW3 is written with a high-level signal, the third transistor M33 is turned on, the switch control signal terminals SW1 and SW2 are written with a low-level signal, the third transistor M31 and the third transistor M32 remain turned off, and only the second signal output terminal Gateout3 outputs the high-level signal output from the first signal output terminal Output. That is, the output of the scanning signals for three rows of gate lines is completed by one shift register.

At a third stage (T3), i.e., a reset stage, the reset signal terminal Reset is written with a high-level signal, the eleventh transistor M11 is turned on, the second power voltage terminal VSS is written with a low power voltage signal to pull down the potential of the pull-up node PU, and at this time, the thirteenth transistor M13, the sixth transistor M6 and the seventh transistor M7 are turned off; the high-level signal input from the high-level signal terminal VGH turns on the fourth transistor M4 and the fifth transistor M5, and pulls up the potential of the pull-down node PD, so that the eighth transistor M8, the ninth transistor M9, and the tenth transistors M101, M102, and M103 are turned on, the low-level signal input from the low-level signal terminal VGL pulls down the pull-up node PU through the eighth transistor M8, pulls down the first signal output terminal Output through the ninth transistor M9, and pulls down the second signal output terminals Gateout1, Gateout2, and Gateout3 through the tenth transistors M101, M102, and M103, respectively.

At a fourth stage (T4), i.e., a noise reduction stage, the twelfth transistor M12 is always turned off, the high-level signal input by the high-level signal terminal VGH controls the fourth transistor M4 and the fifth transistor M5 to be turned on, so that the pull-down node PD is always at a high-level potential, the eighth transistor M8, the ninth transistor M9, the tenth transistor M101, M102, and M103 are all turned on, the low-level signal input by the low-level signal terminal VGL performs noise reduction on the pull-up node PU through the eighth transistor M8, performs noise reduction on the first signal output terminal Output through the ninth transistor M9, and performs noise reduction on the second signal output terminals Gateout1, Gateout2, and Gateout3 through the tenth transistors M101, M102, and M103 respectively, at this time, the coupling noise voltage generated at the clock signal terminal CLK can be eliminated, thereby realizing output of the low-level signal of the first signal output terminal Output, and ensuring stability of signal output.

Before the next frame of picture comes, the shift register repeats the fourth stage, and the noise reduction is continuously performed on the shift register. A period from an end of the current frame of picture to a startg of the next frame of picture is the blank period.

At the blank stage, the first noise reduction control signal terminal TRST1 and the second noise reduction control signal terminal TRST2 are written with high-level signals, the first transistor M1 and the second transistor M2 are turned on, the low-level signal input by the low-level signal terminal VGL performs noise reduction on the pull-up node PU through the first transistor M1, performs noise reduction on the first signal output terminal Output through the second transistor M2, so that when the next frame of picture is displayed, the shift register can stably operates, and the influence of noise on the displayed picture is effectively avoided.

A third specific example, as shown in FIG. 11, the shift register is substantially the same as that in the second specific example, except for the coupling relationship between the three second output sub-circuits 5 and three driving signal terminal TQ1, TQ2, TQ3 and the first signal output terminal Output, respectively. Specifically, in the shift register, gates of all of the three third transistors M31, M32 and M33 are coupled to the first signal output terminal Output, the drain of the third transistor M31 is coupled to the second signal output terminal Gateout1, and the source of the third transistor M31 is coupled to the driving signal terminal TQ1; the drain of the third transistor M32 is coupled with the second signal output terminal Gateout2, and the source of the third transistor M32 is coupled with the driving signal terminal TQ2; the drain of the third transistor M33 is coupled to the second signal output terminal Gateout3, and the source of the third transistor M33 is coupled to the driving signal terminal TQ3. Other structures of the shift register are the same as those in the second specific example, and therefore, the description thereof is omitted.

Figure 12:
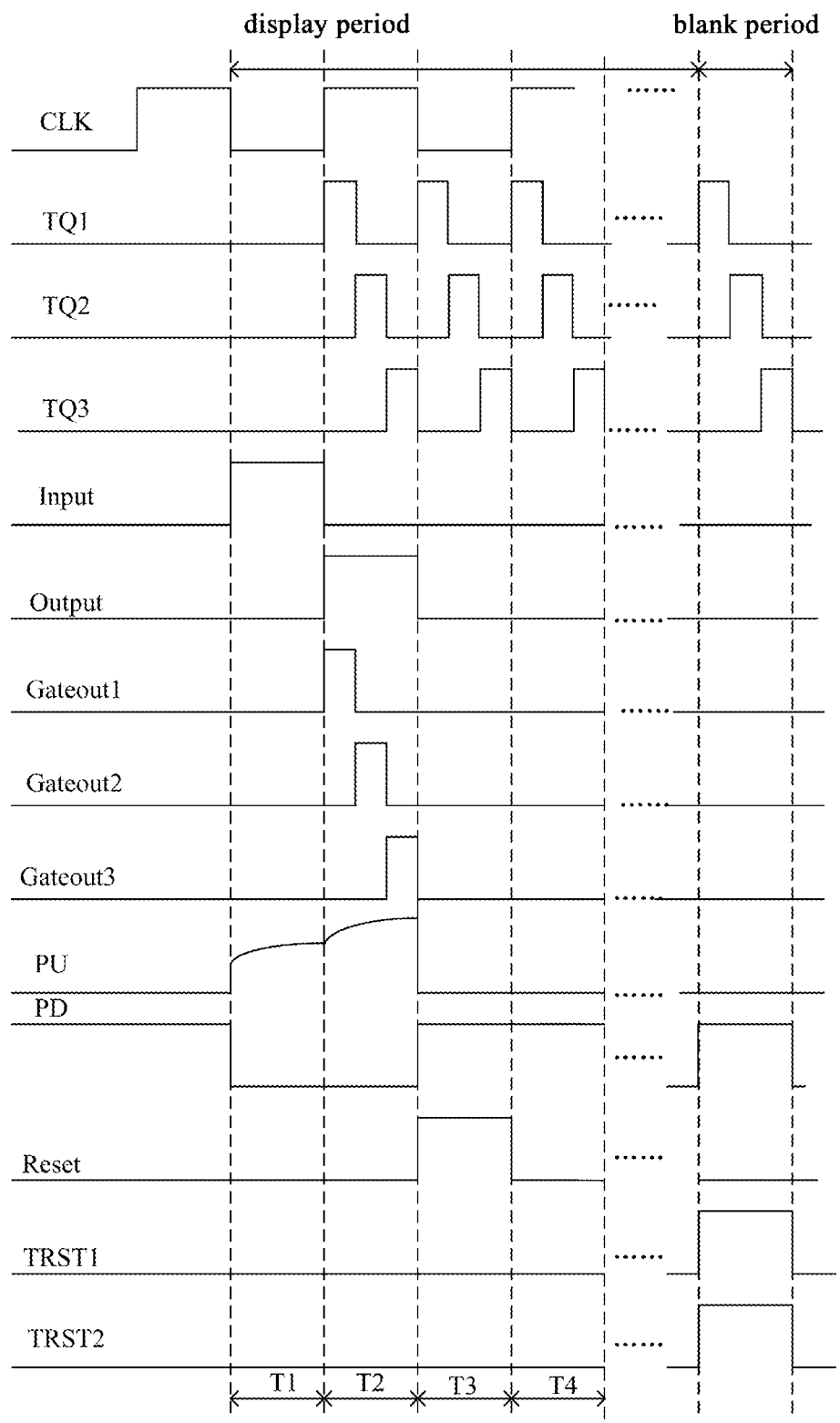
FIG. 12 is timing diagram illustrating operation of the shift register of FIG. 11.

In conjunction with the timing diagram shown in FIG. 12, how a shift register unit operates in the display period of a frame of picture and in the blank period between the display periods of two adjacent frames of pictures will be described so that the shift register of the embodiment of the present disclosure is more clearly understood.

In the display stage of the frame of picture, the driving method of the shift register specifically includes the following stages T1 to T4.

At a first stage (T1), i.e., an input stage, the input signal terminal is written with a high-level signal, the twelfth transistor M12 is turned on, and the clock signal written by the clock signal terminal CLK is a low-level signal, the high power voltage of the first power voltage terminal VDD charges the storage capacitor C1 through the twelfth transistor M12, so that the voltage of the pull-up node PU is pulled up; at this stage, since the pull-up node PU is at a high-level, the sixth transistor M6 and the seventh transistor M7 are turned on, and the pull-down node PD is pulled down by the low-level signal written by the low power voltage terminal, so that the eighth transistor M8, the ninth transistor M9, and the tenth transistors M101, M102, and M103 are kept turned off, and thus the first signal output terminal Output outputs a stable low-level signal.

At a second stage (T2), an output stage, the input signal terminal is written with a low-level signal, the twelfth transistor M12 is turned off, the pull-up node PU keeps at the high-level potential of the first stage, and the thirteenth transistor M13 keeps turned on; at this time, the clock signal terminal CLK is written with a high-level signal, and the voltage of the pull-up node PU is amplified due to a bootstrap effect of the storage capacitor C1, so as to ensure that the thirteenth transistor M13 is continuously turned on, so that the first signal output terminal Output outputs a high-level signal; at this time, since the pull-up node PU is at the high-level, the sixth transistor M6 and the seventh transistor M7 are continuously turned on, and the pull-down node PD is pulled down by the low-level signal written by the low power voltage terminal, so that the eighth transistor M8, the ninth transistor M9, and the tenth transistors M101, M102, and M103 are continuously turned off, so that the first signal output terminal Output outputs a stable high-level signal, and the third transistors M31, M32, and M33 are all turned on; meanwhile, firstly, a high-level signal is written into the driving signal terminal TQ1, and low-level signals are written into the driving signal terminals TQ2 and the TQ3, at this time, only the second signal output terminal Gateout1 outputs the high-level signal output by the first signal output terminal Output; next, a high-level signal is written into the driving signal terminal TQ2, low-level signals are written into the driving signal terminals TQ1 and TQ3, and only the second signal output terminal Gateout2 outputs the high-level signal output by the first signal output terminal Output; a high-level signal is written into the driving signal terminal TQ3, low-level signals are written into the driving signal terminals TQ1 and TQ2, and only the second signal output terminal Gateout3 outputs the high-level signal output by the first signal output terminal Output. That is, the output of the scanning signals for three rows of gate lines is completed by one shift register.

At a third stage (T3), i.e., a reset stage, the reset signal terminal Reset is written with a high-level signal, the eleventh transistor M11 is turned on, the second power voltage terminal VS'S is written with a low power voltage signal to pull down the potential of the pull-up node PU, and at this time, the thirteenth transistor M13, the sixth transistor M6 and the seventh transistor M7 are turned off; the high-level signal input from the high-level signal terminal VGH turns on the fourth transistor M4 and the fifth transistor M5, and pulls up the potential of the pull-down node PD, so that the eighth transistor M8, the ninth transistor M9, and the tenth transistors M101, M102, and M103 are turned on, the low-level signal input from the low-level signal terminal VGL pulls down the pull-up node PU through the eighth transistor M8, pulls down the first signal output terminal Output through the ninth transistor M9, and pulls down the second signal output terminals Gateout1, Gateout2, and Gateout3 through the tenth transistors M101, M102, and M103, respectively.

At a fourth stage (T4), i.e., a noise reduction stage, the twelfth transistor M12 is always turned off, the high-level signal input by the high-level signal terminal VGH controls the fourth transistor M4 and the fifth transistor M5 to be turned on, so that the pull-down node PD is always at a high-level, the eighth transistor M8, the ninth transistor M9, the tenth transistor M101, M102, and M103 are all turned on, the low-level signal input by the low-level signal terminal VGL performs noise reduction on the pull-up node PU through the eighth transistor M8, performs noise reduction on the first signal output terminal Output through the ninth transistor M9, and performs noise reduction on the second signal output terminals Gateout1, Gateout2, and Gateout3 through the tenth transistors M101, M102, and M103, at this time, the coupling noise voltage generated at the clock signal terminal CLK can be eliminated, thereby realizing output of the low-level signal of the first signal output terminal Output, and ensuring stability of signal output.

Before the next frame of picture comes, the shift register repeats the fourth stage, and the noise reduction is continuously performed on the shift register. A period from an end of the current frame of picture to a start of the next frame of picture is the blank period.

At the blank stage, the first noise reduction control signal terminal TRST1 and the second noise reduction control signal terminal TRST2 are written with high-level signals, the first transistor M1 and the second transistor M2 are turned on, the low-level signal input by the low-level signal terminal VGL performs noise reduction on the pull-up node PU through the first transistor performs noise reduction on the first signal output terminal Output through the second transistor M2, so that when a next frame of picture is displayed, the shift register can stably operates, and the influence of noise on the displayed picture is effectively avoided.

In summary, the shift register provided in the embodiments of the present disclosure, due to the addition of the first noise reduction sub-circuit 3 and the second noise reduction sub-circuit 4, can perform noise reduction on the pull-up node PU and the first signal output terminal Output in the blank stage, thereby effectively ensuring the stability of display of the next frame of picture; meanwhile; in the embodiments of the present disclosure, one shift register has a plurality of second output sub-circuits 5, that is, one shift register can provide scanning signals for a plurality of rows of gate lines, so that one shift register can be shared by a plurality of rows of pixel units, thereby reducing the number of shift registers, further reducing a size of a gate driving circuit, reducing a width of a bezel of a display panel, and facilitating implementation of a narrow bezel of the display panel.

Figure 13:
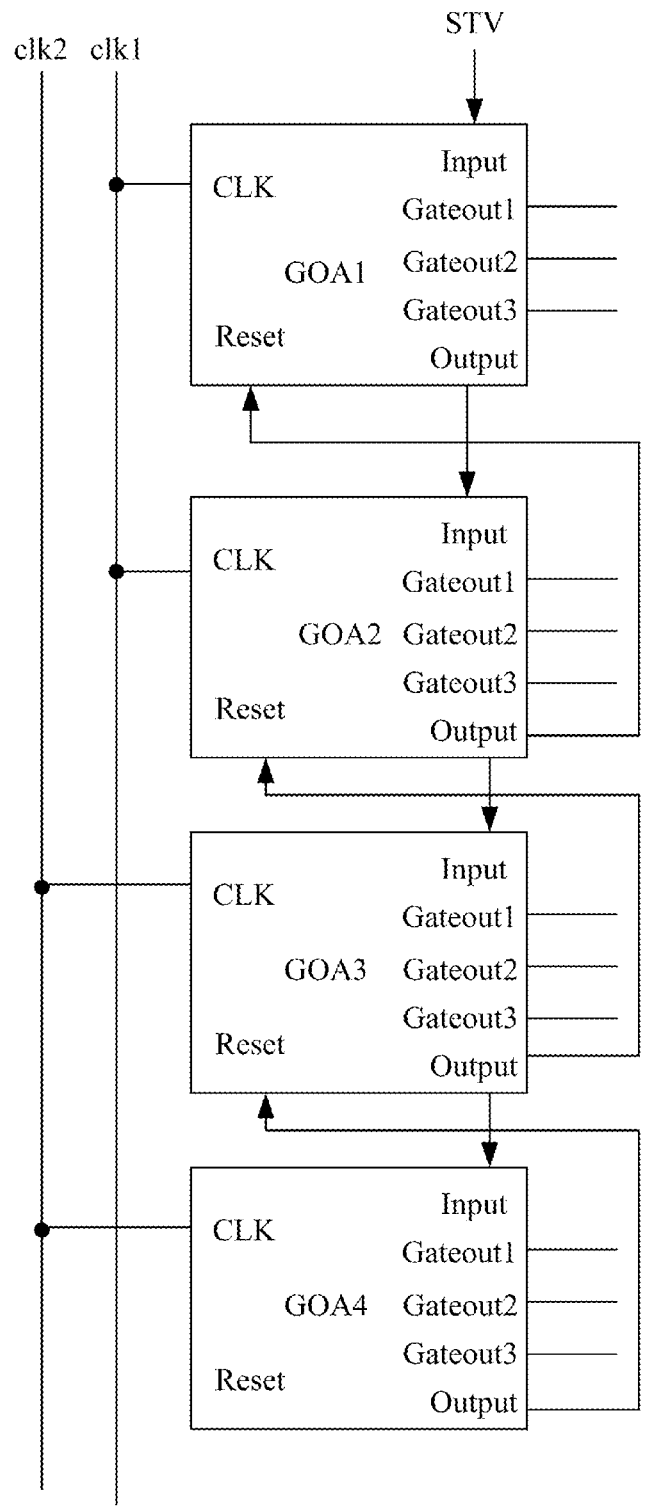
FIG. 13 is a schematic cascade diagram of a gate driving circuit according to an embodiment of the present disclosure.

In a second aspect, as shown in FIG. 13, an embodiment of the present disclosure provides a gate driving circuit, where the gate driving circuit includes cascaded shift registers as described above, except the shift register of a first stage, the signal input terminal of the shift register of a current stage is coupled to the first signal output terminal Output of the shift register of a previous stage; the signal input terminal of the shift register of the first stage is coupled with a frame gating signal; except the shift register of the last stage, the first signal output terminal Output of the shift register of the current stage is coupled with the reset signal terminal Reset of the shift register of the next stage.

FIG. 13 only illustrates four shift registers GOA1, GOA2, GOA3, and GOA4, and the four shift registers are controlled by two clock signal lines, where the shift registers GOA1 and GOA2 are controlled by the clock signal line clk1, and the shift registers GOA3 and GOA4 are controlled by the clock signal line clk2, but the number of the shift registers is not limited to the embodiments of the present disclosure.

It should be noted that the shift register of the first stage and the shift register of the last stage are relative, and are determined by forward scanning and reverse scanning of the gate driver circuit. When the gate driving circuit scan the gate lines in a forward direction, according to the scanning sequence of the gate lines, the shift register providing the scanning signal to the first gate line is the shift register of the first stage, and the shift register providing the scanning signal to the last gate line is the shift register of the last stage. When the gate driving circuit scan the gate lines in a reverse direction, according to the scanning sequence of the gate lines, the last gate line is firstly input with a scanning signal, and thus the shift register providing the scanning signal to the last gate line is the shift register of the first stage, and the shift register providing the scanning signal to the first gate line is the shift register of the last stage. Meanwhile, for achieving the forward scanning or the reverse scanning, it is only need to exchange input signals of the first power voltage terminal VDD and the second power voltage terminal VSS, and exchange signals input by the signal input terminal Input and the reset signal terminal Reset.

Since the gate driving circuit in the embodiment of the present disclosure includes any one of the shift registers described above, noise reduction can be performed on the pull-up node PU and the first signal output terminal Output in the blank period, so that the stability of display of the next frame of picture is effectively ensured.

In some implementations, each shift register in the embodiments of the present disclosure has a plurality of second output sub-circuits 5, so that scanning signals can be provided to a plurality of rows of gate lines through one shift register, and a plurality of rows of pixel units can share one shift register, thereby reducing the number of shift registers, further reducing the size of the gate driving circuit, reducing a size of a bezel of the display panel, and facilitating implementation of a narrow bezel of the display panel.

In a third aspect, an embodiment of the disclosure provides a display panel, which includes the gate driving circuit described above. The gate driving circuit has a good display effect and can realize a narrow-bezel design.

The display device may be any product or component with a display, function, such as a mobile phone, a tablet computer, a television, a display, a notebook computer, a digital photo frame, a navigator and the like.

Certainly, the display device of the present embodiment may further include other conventional structures, such as a power supply unit, a display driving unit, and the like.

It will be understood that the above embodiments are merely exemplary embodiments adopted to illustrate the principles of the present disclosure, and the present disclosure is not limited thereto. It will be apparent to those skilled in the art that various modifications and improvements can be made without departing from the spirit and scope of the disclosure, and such modifications and improvements are considered to be within the scope of the disclosure.

The invention claimed is:

1. A shift register, comprising: an input sub-circuit and a first output sub-circuit;
    the input sub-circuit is configured to pre-charge, in response to an input signal, a pull-up node by a first power voltage; the pull-up node is a coupling node at which the input sub-circuit and the first output sub-circuit are coupled;
    the first output sub-circuit is configured to output a clock signal through a first signal output terminal in response to a potential of the pull-up node; wherein,
    the shift register further comprises a first noise reduction sub-circuit and/or a second noise reduction sub-circuit;
    the first noise reduction sub-circuit is configured to perform, in response to a first noise reduction control signal, noise reduction on the pull-up node through a non-operation level signal in a blank period;
    the second noise reduction sub-circuit is configured to perform, in response to a second noise reduction control signal, noise reduction on the first signal output terminal by a non-operation level signal during the blank period,
    the shift register further comprising: a plurality of second output sub-circuits; each of the plurality of second output sub-circuits is configured to output a signal output from the first signal output terminal through a second signal output terminal corresponding thereto in response to a switch control signal corresponding thereto;
    the shift register further comprising: a pull-down control sub-circuit, a pull-down sub-circuit, a third noise reduction sub-circuit, a fourth noise reduction sub-circuit;
    the pull-down control sub-circuit is configured to transmit, in response to an operation level signal, the operation level signal to a pull-down node; the pull-down node is a coupling node at which the pull-down control sub-circuit and the pull-down sub-circuit are coupled;
    the pull-down sub-circuit is configured to pull down a potential of the pull-down node by the non-operation level signal in response to the potential of the pull-up node;
    the third noise reduction sub-circuit is configured to perform noise reduction on the pull-up node by the non-operation level signal in response to the potential of the pull-down node;
    the fourth noise reduction sub-circuit is configured to perform noise reduction on the first signal output terminal by the non-operation level signal in response to the potential of the pull-down node; and wherein
    the shift register further comprising a plurality of fifth noise reduction sub-circuits provided in one-to-one correspondence with the plurality of second signal output terminals;
    each of the plurality of fifth noise reduction sub-circuits is configured to perform, in response to the potential of the pull-down node, noise reduction on the second output terminal corresponding thereto by the non-operation level signal in the blank period.

2. The shift register of claim 1, wherein the first noise reduction sub-circuit comprises a first transistor;
    a first electrode of the first transistor is coupled with the pull-up node, a second electrode of the first transistor is coupled with a non-operation level terminal, and a control electrode of the first transistor is coupled with a first noise reduction control signal terminal.

3. The shift register of claim 1, wherein the second noise reduction sub-circuit comprises a second transistor;
    a first electrode of the second transistor is coupled with the first signal output terminal, a second electrode of the second transistor is coupled with the non-operation level terminal, and a control electrode of the second transistor is coupled with a second noise reduction control signal terminal.

4. The shift register of claim 1, wherein each of the plurality of second output sub-circuits comprises a third transistor;
    a first electrode of the third transistor is coupled with the first signal output terminal, a second electrode of the third transistor is coupled with the second signal output terminal, and a control electrode of the third transistor is coupled with a switch control signal terminal.

5. The shift register of claim 1, wherein each of the plurality of second output sub-circuits comprises a third transistor;
    a first electrode of the third transistor is coupled with a driving signal terminal corresponding to the third transistor, a second electrode of the third transistor is coupled with the second signal output terminal, and a control electrode of the third transistor is coupled with the first signal output terminal.

6. The shift register of claim 1, wherein the pull-down control sub-circuit comprises a fourth transistor and a fifth transistor;
    a first electrode of the fourth transistor is coupled with a control electrode of the fourth transistor, a first electrode of the fifth transistor and an operation level terminal, and a second electrode of the fourth transistor is coupled with the pull-down sub-circuit and a control electrode of the fifth transistor; and a second electrode of the fifth transistor is coupled to the pull-down node.

7. The shift register of claim 1, wherein the pull-down sub-circuit comprises a sixth transistor and a seventh transistor;
a first electrode of the sixth transistor is coupled with the pull-down node, a second electrode of the sixth transistor is coupled with the non-operation level terminal, and a control electrode of the sixth transistor is coupled with the pull-up node;
a first electrode of the seventh transistor is coupled with a pull-down control sub-circuit, a second electrode of the seventh transistor is coupled with the non-operation level terminal, and a control electrode of the seventh transistor is coupled with the pull-up node.

8. The shift register of claim 1, wherein the third noise reduction sub-circuit comprises an eighth transistor;
a first electrode of the eighth transistor is coupled with the pull-up node, a second electrode of the eighth transistor is coupled with the non-operation level terminal, and a control electrode of the eighth transistor is coupled with the pull-down node.

9. The shift register of claim 1, wherein the fourth noise reduction sub-circuit comprises a ninth transistor;
a first electrode of the ninth transistor is coupled with the first signal output terminal, a second electrode of the ninth transistor is coupled with the non-operation level terminal, and a control electrode of the ninth transistor is coupled with the pull-down node.

10. The shift register of claim 1, wherein each of the plurality of fifth noise reduction sub-circuits comprises a tenth transistor;
a first electrode of the tenth transistor is coupled with the second signal output terminal corresponding to the tenth transistor, a second electrode of the tenth transistor is coupled with the non-operation level terminal, and a control electrode of the tenth transistor is coupled with the pull-down node.

11. The shift register of claim 1, further comprising a reset sub-circuit;
the reset sub-circuit is configured to reset the pull-up node by a second power voltage in response to a reset signal.

12. The shift register of claim 11, wherein the reset sub-circuit comprises an eleventh transistor;
a first electrode of the eleventh transistor is coupled with the pull-up node, a second electrode of the eleventh transistor is coupled with a second power voltage terminal, and a control electrode of the eleventh transistor is coupled with a reset signal terminal.

13. The shift register of claim 1, wherein the input sub-circuit comprises a twelfth transistor;
a first electrode of the twelfth transistor is coupled with a first power voltage terminal, a second electrode of the twelfth transistor is coupled with the pull-up node, and a control electrode of the twelfth transistor is coupled with a signal input terminal.

14. The shift register of claim 1, wherein the first output sub-circuit comprises a thirteenth transistor and a storage capacitor;
a first electrode of the thirteenth transistor is coupled with a clock signal terminal, a second electrode of the thirteenth transistor is coupled with the first signal output terminal and a second terminal of the storage capacitor, and a control electrode of the thirteenth transistor is coupled with the pull-up node and a first terminal of the storage capacitor.

15. A gate driving circuit, comprising: the shift register of claim 1; wherein,
a signal input terminal of the shift register of a current stage is coupled with the first signal output terminal of the shift register of a previous stage; a reset signal terminal of the shift register of the current stage is coupled with the first signal output terminal of the shift register of a next stage.

16. A display panel, comprising the gate driving circuit of claim 15.

* * * * *